(12) United States Patent
Ogiso et al.

(10) Patent No.: US 11,673,108 B2
(45) Date of Patent: *Jun. 13, 2023

(54) SURFACE MODIFYING DEVICE

(71) Applicant: KASUGA DENKI, INC., Kawasaki (JP)

(72) Inventors: Satoru Ogiso, Kawasaki (JP); Takao Morishita, Kawasaki (JP); Yukihira Sakurai, Kawasaki (JP); Junya Yoshida, Kawasaki (JP); Satoshi Sugimura, Kawasaki (JP)

(73) Assignee: KASUGA DENKI, INC., Kanagawa (JP)

( * ) Notice: Subject to any disclaimer, the term of this patent is extended or adjusted under 35 U.S.C. 154(b) by 557 days.

This patent is subject to a terminal disclaimer.

(21) Appl. No.: 16/637,241

(22) PCT Filed: Aug. 7, 2017

(86) PCT No.: PCT/JP2017/028617
§ 371 (c)(1),
(2) Date: Feb. 6, 2020

(87) PCT Pub. No.: WO2019/030804
PCT Pub. Date: Feb. 14, 2019

(65) Prior Publication Data
US 2020/0236771 A1 Jul. 23, 2020

(51) Int. Cl.
*H05H 1/24* (2006.01)
*B01J 19/08* (2006.01)
(Continued)

(52) U.S. Cl.
CPC ....... *B01J 19/088* (2013.01); *H01J 37/32073* (2013.01); *H05H 1/30* (2013.01);
(Continued)

(58) Field of Classification Search
CPC ...... H05H 1/2406; H05H 1/3478; H05H 1/30; H05H 1/34; H05H 1/48; H05H 1/47;
(Continued)

(56) References Cited

U.S. PATENT DOCUMENTS

| 4,940,521 A | 7/1990 | Dinter et al. |
| 4,946,568 A | 8/1990 | Kalwar et al. |

(Continued)

FOREIGN PATENT DOCUMENTS

| JP | 63-51938 | 3/1988 |
| JP | 2-99163 | 4/1990 |

(Continued)

*Primary Examiner* — Xiuyu Tai
(74) *Attorney, Agent, or Firm* — Cozen O'Connor

(57) ABSTRACT

A discharge electrode E in an electrode chamber C comprises a plurality of electrode members 8, 9. The electrode members 8, 9 are disposed facing each other by having a supporting member 4 therebetween, a gap is formed between the facing portions of the electrode members 8, 9, and by having the gap as a gas passageway 15, the gas passageway is opened in the leading end of the discharge electrode. A replacement gas having been supplied from a manifold pipe 3 is supplied to the gas passageway 15 via an orifice.

17 Claims, 7 Drawing Sheets

(51) Int. Cl.
    *H05H 1/34*     (2006.01)
    *H05H 1/30*     (2006.01)
    *H01J 37/32*    (2006.01)
    *B29C 59/14*    (2006.01)

(52) U.S. Cl.
    CPC ............ *H05H 1/34* (2013.01); *H05H 1/3478* (2021.05); *B01D 2259/818* (2013.01); *B01J 2219/0875* (2013.01); *B29C 59/14* (2013.01); *H01J 37/3244* (2013.01)

(58) Field of Classification Search
    CPC ...... H05H 1/24; H05H 2245/36; H05H 1/471; B01D 2259/818; B01J 2219/0875; B29C 59/14; B29C 59/12; B29C 71/04; H01J 37/3244; H01J 37/32018; H01J 37/32541; H01J 37/32568; H01J 37/32073; H01J 37/3277; H01J 37/32825; H01J 37/32009; H01J 2237/33; H01T 19/00; B05D 3/145; B05D 1/12; B05D 5/02; Y10T 428/24372; Y10T 428/273; Y10T 428/26; Y10T 428/27; Y10T 428/31855; Y10T 428/31786; Y10T 428/24388; Y10T 428/24405; Y10T 428/24421; Y10T 428/2438; Y10T 428/31; Y10T 428/24355
    See application file for complete search history.

(56) References Cited

U.S. PATENT DOCUMENTS

| | | | | |
|---|---|---|---|---|
| 5,224,441 | A | * | 7/1993 | Felts ....................... C23C 16/50 118/724 |
| 5,645,919 | A | * | 7/1997 | Bothe .................... B05D 3/145 204/170 |
| 6,099,810 | A | * | 8/2000 | Bloss ..................... B29C 59/12 422/186.21 |

FOREIGN PATENT DOCUMENTS

| | | |
|---|---|---|
| JP | H 06-002830 | 1/1994 |
| JP | 2004-006586 | 1/2004 |
| JP | 2005-243600 | 9/2005 |
| JP | 2006-004686 | 1/2006 |
| JP | 6183870 | 8/2017 |

* cited by examiner

SURFACE MODIFYING DEVICE

PRIORITY CLAIM

This is a U.S. national stage of application No. PCT/JP2017/028617, filed on Aug. 7, 2017, the content of which is incorporated herein by reference.

TECHNICAL FIELD

The present invention relates to a surface modifying device that uses a corona discharge to perform surface treatment on the surface of a base material.

BACKGROUND ART

About this type of surface modifying devices, a conventional example of using a resin-made film as a base material is described.

A discharge electrode is installed in an electrode chamber and a treatment roller serving as a counter electrode is placed facing the discharge electrode.

And, a replacement gas appropriate to desired surface modification is supplied into the electrode chamber. Then, the inside of the electrode chamber is maintained with an atmosphere of the replacement gas and also a high-frequency voltage is applied to the discharge electrode to generate an electric field between the discharge electrode and the above-described treatment roller.

The surface of the resin-made film transferred along the treatment roller is modified by the replacement gas being supplied into the electric field thus generated.

And, since the surface modification varies in precision according to concentrations of the replacement gas in the electrode chamber, if the concentration of the replacement gas is nonuniform, modification precision varies between higher concentration region and lower concentration region.

Also, the electrode chamber should be formed in a size corresponding to the size of a resin-made film transferred by the treatment roller. Therefore, if the resin-made film has a width reaching 10 meters, the electrode chamber must accommodate the width of the resin-made film. This significantly increases the capacity of the electrode chamber.

The amount of replacement gas supplied is unavoidably required to increase in order to maintain a uniform gas concentration within the electrode chamber with such a large capacity, and accordingly the production efficiency suffers.

To address this, Japanese Application No. H06-002830 discloses a method to supply replacement gas directly to a local area which is a discharge region between a discharge electrode and a treatment roller serving as a counter electrode.

For example, the device disclosed in Japanese Application No. H06-002830 is configured to supply directly replacement gas from the discharge electrode. If configured in this manner, the replacement gas can be supplied directly to a local area such as a discharge region between the discharge electrode and the treatment roller, and therefore the replacement gas concentration in the local area is easily maintained uniformly. In addition, since there's no need to fill the entire electrode chamber with the replacement gas, the amount of replacement gas usage can be decreased accordingly.

And, the discharge electrode of the device in Japanese Application No. H06-002830 is made up of a block having a length approximately corresponding to the width of the resin-made film, and also a slit is formed in the length direction of the block which is the discharge electrode. The slit is coupled to a gas supply source from which the replacement gas is supplied.

Thus, the replacement gas supplied from the gas supply source is supplied directly to a local area which is a discharge region from the slit.

Such a direct supply of the discharge gas to the discharge region as described above enables an extreme decrease in the amount of replacement gas supplied as compared with the supply of the replacement gas into the entire electrode chamber.

Also, because the replacement gas can be supplied to the local area which is the discharge region, even if the amount of replacement gas supplied is reduced, this has little influence on the plasma generation.

By direct supply of the replacement gas to a local area such as the discharge region in this manner, the effect of reducing the amount of replacement gas supplied can be expected without lowering the plasma generation capability.

If the gas supply source is coupled directly to the slit as described above, this makes it difficult to maintain a uniform gas pressure in the longitudinal direction of the slit, such as higher gas pressure in a region close to a gas supply pipe and lower gas pressure in a region away from the gas supply pipe.

Such a nonuniform distribution of the gas pressure in the slit results in variations in gas amount from region to region, thus varying surface modification precision.

In particular, under the theme "a reduction in the amount of replacement gas supplied", such nonuniformity in gas pressure distribution as described above becomes a problem. This is because, if the amount of replacement gas supplied is reduced, the amount of replacement gas is extremely decreased in a region in which the gas pressure is low, and accordingly the surface modification precision is impaired in this region. If the stability of the gas concentration is impaired as describe above, the surface modification on the base material becomes unstable, as a result of which the advantages that the amount of gas supply is able to be reduced are all offset.

Also, the longer the length of the discharge electrode, the more the pressure distribution of replacement gas in the slit becomes unstable. As a result, there is a problem in which the conventional discharge electrode cannot be used for the surface modification on a resin-made film with a width of around 10 meters, for example.

It is an object of the present invention to provide a surface modifying device capable of performing stable surface modifying treatment while a reduced amount of replacement gas supplied is achieved.

SUMMARY OF INVENTION

A first aspect of the present invention provides a surface modifying device that includes: holding means for holding a base material to undergo surface modifying treatment; an electrode chamber; a manifold pipe that is secured to the electrode chamber through a coupling member and connected to a gas supply source; a discharge electrode that includes a plurality of electrode members supported either directly or via a supporting member by the manifold pipe, and maintained in length in a width direction of the base material; a counter electrode that is disposed on the opposite side of the base material from the discharge electrode to face the discharge electrode, and allows an electric field to be generated between the discharge electrode and the counter electrode; a gas passageway that is formed between adjacent face-to-face electrode members of the plurality of electrode members of the discharge electrode, the gas passageway guiding replacement gas along the electrode members toward the base material, and ejecting the replacement gas toward a generation area of the electric field; and orifices that are disposed in a communication process between the manifold pipe and the gas passageway, and continuously disposed in a length direction of the manifold pipe. The manifold pipe constitutes a support mechanism for the discharge electrode.

The manifold pipe and the discharge electrode are maintained in length in the width direction of the base material, and a predetermined length may be implemented by a single manifold pipe/discharge electrode, or alternatively, a predetermined length may be implemented by coupling a plurality of discharge electrodes together.

Also, the manifold pipe and the discharge electrode may be divided into multiple pieces, and the multiple manifold pipes and discharge electrodes may be arranged in a staggered configuration in the transfer direction of a resin-made film, and the manifold pipes and the discharge electrodes may have entirely a length corresponding to the width of the surface modification of the resin-made film.

It is noted that, in the present invention, the manifold pipe constitutes a support mechanism for supporting the discharge electrode, but the discharge electrode may be secured directly to the manifold pipe or alternatively secured indirectly via a supporting member and/or the like.

Further, in some base materials, a part in the width direction thereof may be required to undergo the surface modification. In this case, the discharge electrode may be maintained in a length corresponding to the width of the part required to undergo the surface modification. However, in this case, it is understandable that the multiple divided discharge electrodes can be used as well.

In a second aspect of the present invention, a single manifold pipe is disposed in a length direction of the discharge electrode.

In a third aspect of the present invention, a plurality of manifold pipes is arranged in line in a length direction of the discharge electrode.

Further, in a fourth aspect of the present invention, a plurality of manifold pipes is arranged in parallel in a width direction of the discharge electrode.

It is noted that the multiple manifold pipes may be connected in parallel to a single gas supply source, or connected to separate gas supply sources. Note however that, where the manifold pipes are connected respectively to the separate gas supply sources, if a flow control valve is installed in the passage process connecting each manifold pipe to the gas supply source, the amount of gas supplied to each manifold pipe can be freely adjusted.

Also, where the multiple manifold pipes are provided as described above, a reduction in volumetric capacity of each individual manifold pipe can be achieved. Reducing the volumetric capacities in this manner facilitates averaging the gas pressure distribution in the manifold pipes accordingly.

In a fifth aspect of the present invention, either a plurality of small holes or one or more slits constituting the orifices is continuously disposed in the length direction of the manifold pipe.

And, in a sixth aspect of the present invention, either the plurality of small holes or the one or more slits constituting the orifices is formed directly in the manifold pipe.

For the slit, a seam in the circumferential direction of the manifold pipe may be utilized, or alternatively the slit may be formed independently of the seam.

Also, multiple slits each having a short length may be provided in the length direction of the manifold pipe.

In either case, directly forming the orifices in the manifold pipe allows the arrangement of the orifices to be automatically determined by disposing the manifold pipes in predetermined places.

In a seventh aspect of the present invention, a porous body is incorporated in the manifold pipe, a large number of continuous small holes possessed by the porous body is defined as the orifices.

Examples of the porous body include sintered metal, synthetic resin, metallic mesh, ceramics, nonwoven textile and the like. In the present invention, materials of the porous body are not limited to a particular material as long as it exerts the throttle effect on the gas flowing through it.

In an eighth aspect of the present invention, the orifices disposed in a communication process between the manifold pipe and the gas passageway are formed in a throttle member disposed between the manifold pipe and the gas passage.

As long as the throttle member is disposed between the manifold pipe and the gas passage, the mounting position of the throttle member is not limited to a particular one.

In a ninth aspect of the present invention, the throttle member comprises a porous body, and the orifices comprise a large number of continuous small holes of the porous body.

Examples of the porous body include sintered metal, synthetic resin, metallic mesh, ceramics, nonwoven textile and the like. Materials of the porous body are not limited to a particular material as long as it exerts the throttle effect on the gas flowing through it.

In a tenth aspect of the present invention, the supporting member extending in the length direction of the manifold pipe is secured to the manifold pipe. The plurality of electrode members face each other with the supporting member clamped between the electrode members, and the supporting member has gas guide holes formed therein in a longitudinal direction of the manifold pipe, the plurality of gas guide holes communicating with the manifold pipe and the gas passageway.

In an eleventh aspect of the present invention, the supporting member constitutes the throttle member, and the gas guide holes constitute the orifices.

The manifold pipe and the supporting member are combined to support the discharge electrode. This obviates the need to provide a special member for supporting the discharge electrode.

In a twelfth aspect of the present invention, the supporting member includes a porous body, a large number of continuous small holes of the porous body constitutes the orifices and the gas guide holes.

It is noted that the porous body constituting the supporting member must have a form retaining function for functioning as at least the supporting member. Insofar as a porous body has the form retaining function, provided that it can exert the throttle effect on the gas flowing through it, the porous body, such as sintered metal, synthetic resin, metallic mesh, ceramics, nonwoven textile and the like, may be used without limitation to a particular material.

In a thirteenth aspect of the present invention, the electrode members constituting the discharge electrode are each formed of a plate shaped body. Therefore, using a thin plate shaped body enables a reduction in size of the discharge electrode.

In a fourteenth aspect of the present invention, the holding means constitutes a treatment roller for transportation of the base material made up of an overlength item.

As a base material made up of an overlength item, for example, a resin-made film is a typical example. Other than the resin-made film, a long-continued steel sheet, plate-shaped synthetic resin and the like can be considered.

Also, the base material is not needed to be wrapped around the treatment roller, and as long as the base material can be transferred by rotation of the treatment roller, any treatment roller may be used.

In a fifteenth aspect of the present invention, the holding means constitutes any one of a conveyor on which the base material is loaded, a table on which the base material is loaded, and a hand of a robot arm on which the base material is loaded.

In a sixteenth aspect of the present invention, the holding means serves also as a counter electrode.

In a seventeenth aspect of the present invention, at least any one of the discharge electrode and the counter electrode is enclosed with dielectric material.

Also, enclosing at least anyone of the discharge electrode and the counter electrode with dielectric material is effective for the base material made of an electric conductor. If the base material is an electric conductor, a short circuit connected through a conductor with low resistance is made between the discharge electrode and the counter electrode.

However, such a short circuit as described above is not made by enclosing at least any one of the discharge electrode and the counter electrode with a dielectric material as described above.

With the surface modifying device according to the present invention, the gas pressure is able to be maintained uniform in the manifold pipe having a certain length. If the gas pressure is maintained uniform in the manifold pipe, even when a small amount of replacement gas is introduced into the manifold pipe, the replacement gas can be evenly supplied through the electric field. Therefore, full use of the advantage that the amount of gas supply is minimized is made, while the purpose of stabilizing the surface modifying treatment on the base material can be attained with reliability.

Further, even if there is a little change in pressure on the gas supply source side, the manifold pipe functions as a buffer. Hence, more or less pressure variations on the gas supply source side produce little influence on the surface modification treatment.

Also, the manifold pipe constitutes the support mechanism for the discharge electrode, whereby use of dual-purpose members enables the simplification of the overall configuration accordingly.

Further, because the facing separation between multiple electrode members is used as a gas passageway, this obviates the needs to perform perforating to form a gas passageway and the like. In addition, because sizes of the facing separations may be freely set, a higher degree of flexibility in selecting a size of a gas passageway is offered.

Moreover, because the gas can be ejected from the distal end of the discharge electrode, even when a small amount of gas is used, necessary plasma can be stably generated.

DESCRIPTION OF EMBODIMENTS

Figure 1:
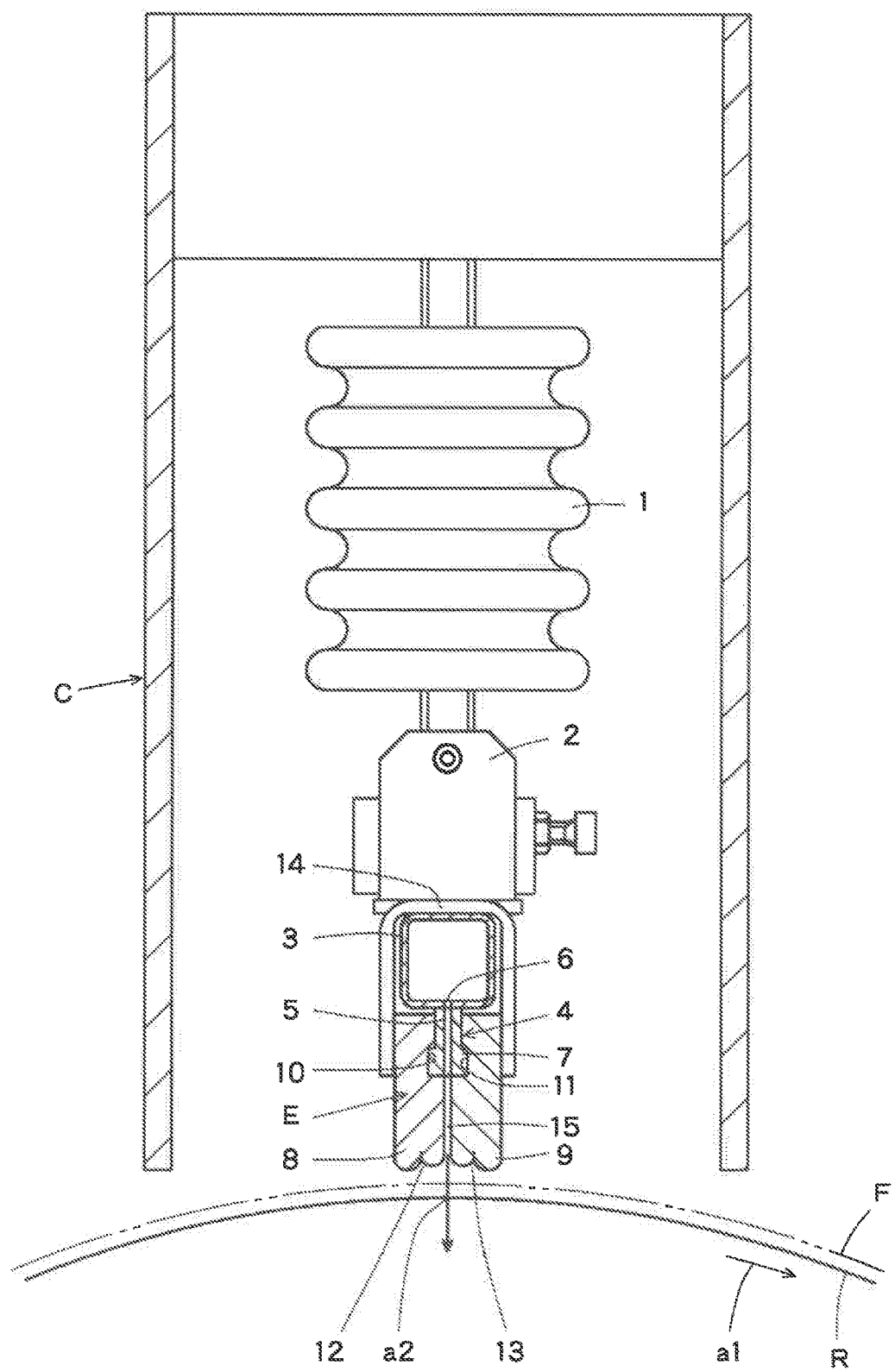
FIG. 1 is an enlarged view illustrating the inside of a discharge chamber according to a first embodiment.
Figure 2:
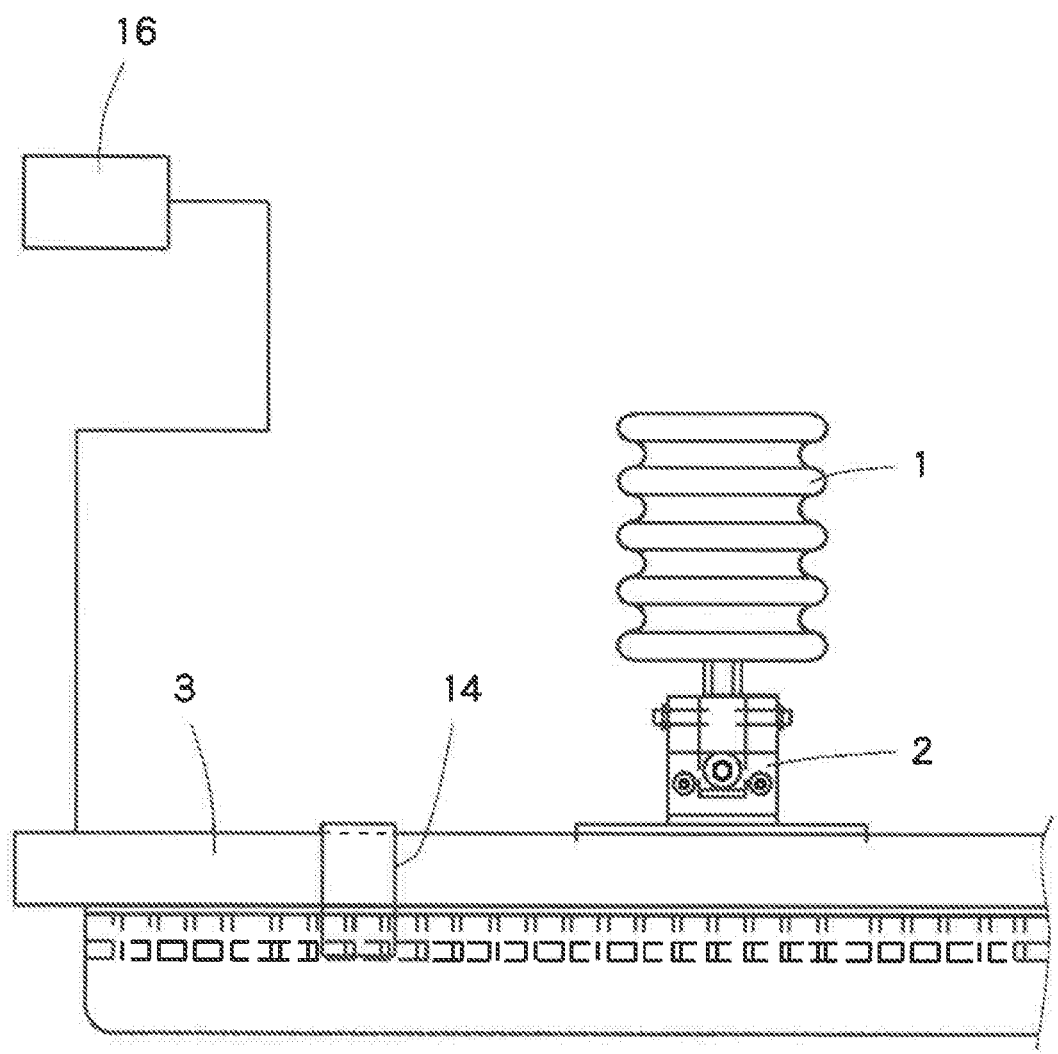
FIG. 2 is a view in the longitudinal direction of a discharge electrode according to the first embodiment, which illustrates a cut off part of the discharge electrode.

A first embodiment illustrated in FIGS. 1 and 2 relates to a surface modifying device according to the present invention which continuously modifies the surface of an overlength, resin-made film F which is a base material in the present invention.

In the first embodiment, an opening of an electrode chamber C is placed to face a treatment roller R transferring the resin-made film F in a direction of arrow a1.

It is noted that the treatment roller R is electrically grounded, so that the treatment roller R doubles as a counter electrode and holding means in the present invention.

An insulator 1 is secured to the face of the electrode chamber C on the opposite side from the opening, and in turn a coupling member 2 is secured to the insulator 1. Further, a manifold pipe 3 made of an electric conductor is secured to the coupling member 2. The manifold pip 3 configured in this manner is connected to a gas supply source which is not shown.

It is noted that the manifold pipe 3 maintains a length corresponding to a width of the resin-made film F transferred by the treatment roller R.

Also, to the face of the manifold pipe 3 on the opposite side from the coupling member 2, a supporting member 4 made of an electric conductor is secured with screws or the like, not shown, the supporting member 4 having a length approximately equal to that of the manifold pipe 3.

In the supporting member 4 configured in this manner, a plurality of gas guide holes 5 is formed contiguously at regular spacings in the length direction of the supporting member 4. The gas guide holes 5 communicate with small holes 6 formed in the manifold pipe 3.

Thus, the replacement gas introduced into the manifold pipe 3 is guided from the small holes 6 into the gas guide holes 5.

It is noted that the plurality of gas guide holes 5 are all identical in opening diameter with each other, and the gas guide holes 5 also each have a function as orifices exerting throttle effects on a gas flow passing through there. Therefore, the supporting member 4 serves also as a throttle member in the present invention.

Further, an engagement protrusion 7 expanding outward is formed at a distal end portion of the supporting member 4 on the opposite side from the manifold pipe 3 so that a discharge electrode E described below is engaged with the engagement protrusion 7.

The discharge electrode E is composed of multiple plate-shaped electrode members 8, 9 each having a length corresponding to the width of the resin-made film F which is the base material.

The multiple electrode members 8, 9 face each other, and have mutually facing faces in which engagement recesses 10, 11 are respectively formed to face each other and continue in the length direction of the electrode members 8, 9. Each of the engagement recesses 10, 11 configured in this manner retains a size allowed to be fitted over the engagement protrusion 7 formed on the support member 4.

Further, two arcs are continuously formed on each of the distal end portions of the electrode members 8, 9, and each of vortex generation grooves 12, 13 is formed between the two arcs. The vortex generation grooves 12, 13 have lengths corresponding to the electrode members 8, 9.

The electrode members 8, 9 configured in this manner face each other across the supporting member 4 by fitting their engagement recesses 10, 11 over the engagement protrusion 7 of the supporting member 4, and also the multiple electrode members 8, 9 thus facing each other are clamped by a holder 14.

By being clamped by the holder 14 in this manner, the engagement recesses 10, 11 of the electrode members 8, 9 are prevented from being detached from the engagement protrusion 7 so that the electrode members 8, 9 are firmly supported to the support member 4.

Also, a gap continuing in the length direction of the electrode members 8, 9 is created between the facing portions of the multiple electrode members 8, 9 supported by the supporting member 4, and the gap is a gas passageway 15. And, the multiple gas guide holes 5 all communicate with the gas passageway 15. In addition, the gas passageway 15 is open to the facing region between the discharge electrode E and the treatment roller R.

It is apparent that the gas guide holes 5 exerting the throttle effect on the gas flow constitute orifices in the present invention, and also the orifices are disposed in the communication process between the manifold pipe 3 and the gas passageway 15.

It is noted that the manifold pipe 3, the supporting member 4 and the electrode members 8, 9 are each formed of an electric conductor, and upon application of high voltage from a high voltage source 16 to the manifold pipe 3, an electric field is generated between the discharge electrode E and the treatment roller R which is the counter electrode.

In the configuration as described above, upon supply of replacement gas to the manifold pipe 3, the replacement gas passes through the small holes 6 and the gas guide holes 5 and then is emitted from the gas passageway 15 toward the direction of arrow a2. Stated another way, because the replacement gas is emitted from between the multiple electrode members 8, 9, the replacement gas is emitted directly to a local area in which the electric field is generated.

In addition, because the multiple gas guide holes 5 function as orifices identical in opening diameter as described earlier, a throttle resistance is added to the gas flow passing through the gas guide holes 5. Therefore, a uniform pressure is maintained in the manifold pipe 3 upstream of the gas guide holes 5, so that the gas pressures emitted from the multiple gas guide holes 5 become equal.

Further, even if there is a little change in pressure on the gas supply source side, the manifold pipe 3 functions as a buffer. Hence, more or less pressure variations on the gas supply source side produce little influence on the surface modification.

Further, the length of each gas guide hole 5 in the gas ejection direction can be increased to some extent, so that, in combination with the function of maintaining the pressure in the manifold pipe 3, directivity can be imparted to the gas flow emitted from the gas guide hole 5. Because the gas flow is given directivity in this manner, the diffusion of the replacement gas is prevented to aid in maintaining the replacement gas at a constant concentration. Also, the directivity of the gas flow exerts the function as a gas curtain for air borne into the electrode chamber C by an entrained flow entrained by the resin-made film F.

Further, a controller, not shown, is configured to correlate and control the output of the high voltage source 16 which is an energy source for electric field generation, and the rotation speed of the treatment roller R. And, the controller relatively controls the transfer speed of the resin-made film F and the discharge current, whereby even if the amount of replacement gas is small, more stable treatment effects can be exerted.

Also, because the distal end of each of the multiple electrode members 8, 9 is rounded in an arc shape to remove sharp edges, a discharge is not concentrated in a part of the distal end of each electrode member 8, 9.

According to the first embodiment as described above, the gas passageway 15 is automatically formed by fitting the engagement recesses 10, 11 of the multiple electrode members 8, 9 over the engagement protrusion 7 of the supporting member 4, and also the gas passageway communicates with the gas guide holes 5. And, a perforating process in the direction of gas flowing suffices to form the gas guide holes 5, and the perforating process can be accurately performed at any time as long as a cutting tool with specified dimensions is selected. In other words, there is no difficulty in forming a long slit, and the like.

It is noted that, in the above-described first embodiment, the manifold pipe 3 secured to the coupling member 2 and the supporting member 4 secured to the manifold pipe 3 are combined to configure a support mechanism for the discharge electrode E according to the present invention.

Also, the supporting member 4 configures a throttle member according to the present invention, and also the gas guide holes 5 configure orifices according to the present invention.

Therefore, in the first embodiment, the supporting member 4 serves as a component of the support mechanism and also as a throttle member.

It is noted that the supporting member 4 itself may be formed of porous body and a large number of continuous small holes possessed by the porous body may be the orifices according to the present invention. In this case, the gas guide holes 5 become unnecessary.

The porous body as described above is required to have the function of supporting the discharge electrode E, and thus the porous body must have the form retaining function.

Also, if the supporting member 4 is formed of porous body, the periphery of the supporting member 4 is required to be covered or coated with hermetic materials in order to prevent gas leakage from the periphery.

Materials of the porous body are not limited particularly as long as the material possesses a large number of continuous small holes and also has the form retaining function. As materials of the porous body, for example, sintered metal, metallic mesh, synthetic resin, ceramics, nonwoven textile and the like may be considered.

Then, if the supporting member 4 which is a porous body is formed of insulating material such as synthetic resin, ceramics or nonwoven textile, the electrode members 8, 9 forming the discharge electrode E illustrated in FIG. 1 are required to contact directly the manifold pipe 3, or alternatively, an electric conductor is required to be interposed between the discharge electrode E and the manifold pipe 3.

Also, in the first embodiment, a single manifold pipe 3 is installed in the length direction of the discharge electrode E. However, the manifold pipe 3 may be divided into two or more pieces, and the two or more manifold pipes 3 may be arranged in line in the length direction of the discharge electrode E.

It is noted that if the two or more manifold pipes 3 are arranged in line in the length direction of the discharge electrode E as described above, spacing may or may not be provided between adjacent manifold pipes.

If the two or more manifold pipes 3 are arranged in line in the length direction of the discharge electrode E, the orifices may have different opening diameters for each manifold pipe.

If the opening diameters of the orifices are varied in this manner, the concentrations of replacement gas supplied to the electric fields differ for each manifold pipe section.

However, where surface modifying treatment is performed on, for example, a base material with a wide width such as, e.g., a resin-made film or the like, the base material may be required to be treated by use of different concentrations of replacement gas in different areas divided in the width direction of the base material. It is more advantageous for such a case that the two or more manifold pipes are arranged in line in the length direction of the discharge electrode and the orifices in the manifold pipes differ in opening diameter.

Also, the two or more manifold pipes may be supplied with different replacement gases. In the case of supplying different replacement gases, different treatments in terms of qualities can be performed on each area divided in the width direction of the above-described resin-made film with a wide width or the like.

It is noted that, where the two or more manifold pipes are supplied with different replacement gases, a benefit of providing constant spacing between manifold pipes arranged in line is that different replacement gases are not mixed.

Figure 3:
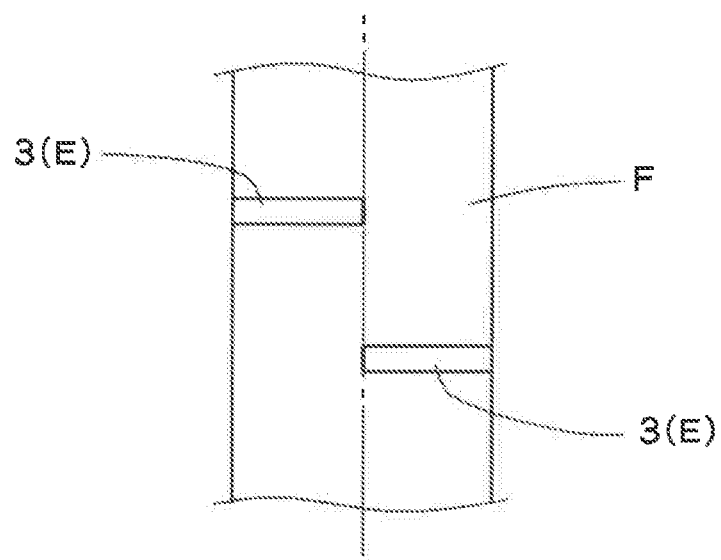
FIG. 3 is an explanatory schematic diagram according to a second embodiment.

FIG. 3 illustrates a second embodiment in which the manifold pipe 3 and the discharge electrode E are divided into multiple pieces, and the multiple manifold pipes 3 and discharge electrodes E are arranged in a staggered configuration in the transfer direction of the resin-made film F, while the manifold pipes 3 and the discharge electrodes E have entirely a length corresponding to the width of the resin-made film F.

Also, the manifold pipe 3 and the discharge electrode E may have a length shorter than the width of the resin-made film F which is the base material, so that only an area defined by the manifold pipe 3 and the discharge electrode E may be treated.

Figure 4:
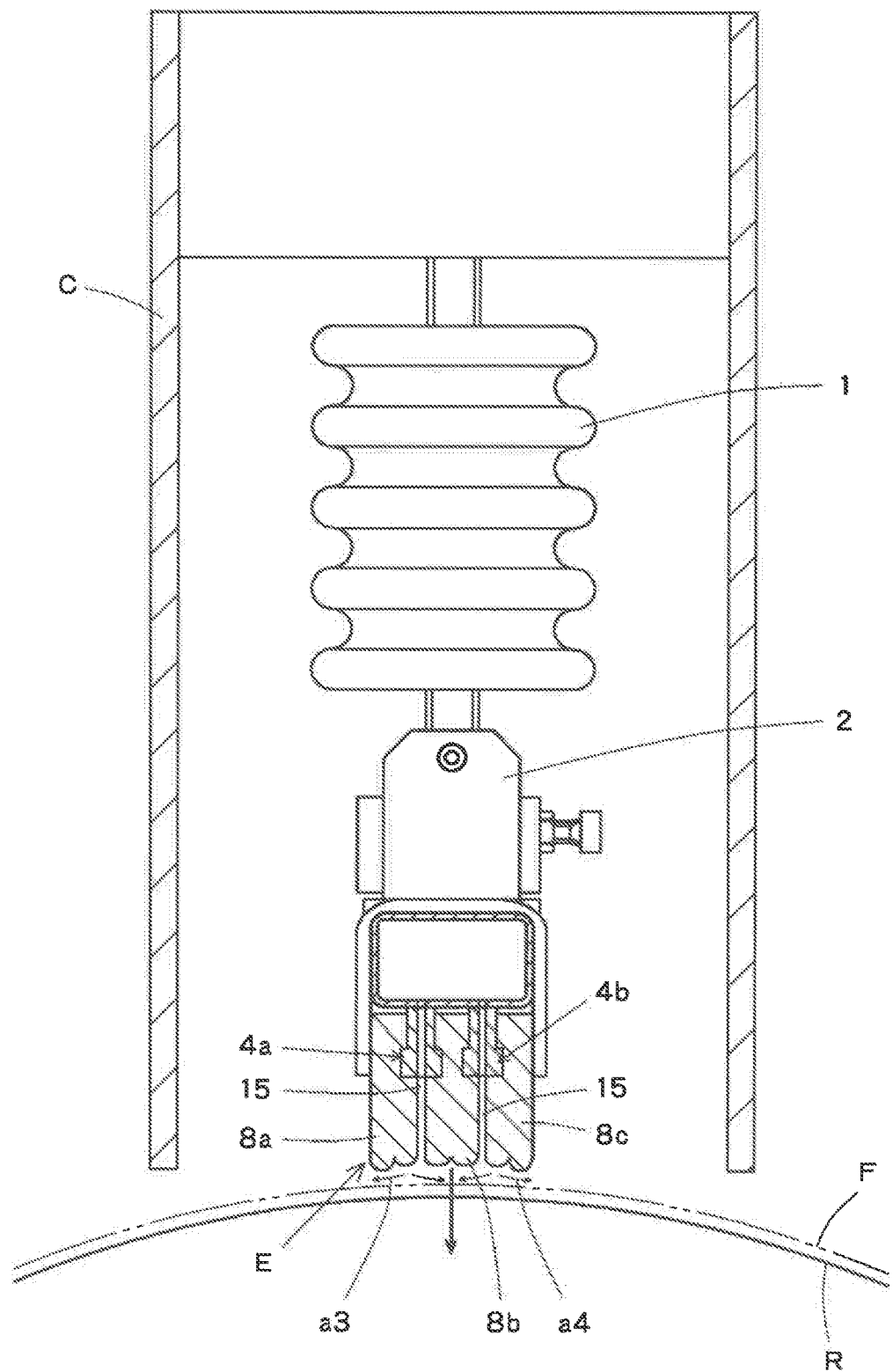
FIG. 4 is a partially enlarged cross sectional view according to a third embodiment.

FIG. 4 illustrates a third embodiment in which three electrode members 8a, 8b, 8c are connected in the width direction of the discharge element E.

Specifically, the width of the manifold pipe 3 is wider than that in the first embodiment and two supporting members 4a, 4b are spaced and secured to the widened manifold pipe 3.

Then, the coupling structure of the supporting members 4a, 4b and the electrode members 8a, 8b, 8c is the same as that in the first embodiment, and details are omitted.

In the third embodiment configured in this manner, because the three electrode members 8a, 8b, 8c are connected to increase the width of the discharge electrode E, a benefit of this is that the range of generating an electric field is increased accordingly.

In the third embodiment, also, the replacement gas is ejected from the two gas passageways, and then the replacement gas hits the resin-made film to be diverted in directions of arrows of FIG. 4.

At this time, a portion of the replacement gas escapes outward as shown by arrows a3, a4, but at this time, the gaps between the electrode member 8a and the resin-made film F and the electrode member 8c and the resin-made film F exert the throttle function to prevent giving rise to pressure losses, so that the pressure inside the electrode members 8a, 8b, 8c increases.

Therefore, the replacement gas ejected from the gas passageways is pushed by the pressure increased as described above, and consequently is concentrated on the center of the discharge electrode E.

It is noted that, in the third embodiment, the middle electrode member 8b is made up of a single plate, but it may be divided at the center to be configured similarly to a configuration of mounting two sets of discharge electrodes according to the first embodiment.

And, the supporting member 4 may be also formed of a porous body in the third embodiment, as in the case of the first embodiment.

Also, the manifold pipe 3 and the supporting members 4a, 4b in the third embodiment are combined to configure a support mechanism for the discharge electrode E.

A single manifold pipe 3 is used in the third embodiment, but two or more manifold pipes 3 may be arranged in parallel in the width direction of the discharge electrode E. In this case, supporting members 4a, . . . , 4n are mounted from one to another of manifold pipes 3, . . . , 3n. In this case, the number of electrode members 8a, . . . , 8n of the discharge electrode E is also increased based on the number of supporting members 4a, . . . , 4n.

Also, the above-described multiple connected electrode members 8a, . . . , 8n are configured to be equal in facing separation between the treatment roller R which is the counter electrode and the electrode members. Therefore, in the case of an arc surface such as the treatment roller R, the electrode members 8a, . . . , 8n may be preferably arranged along the arc surface of the treatment roller R in the width direction of the discharge electrode E.

Figure 5:
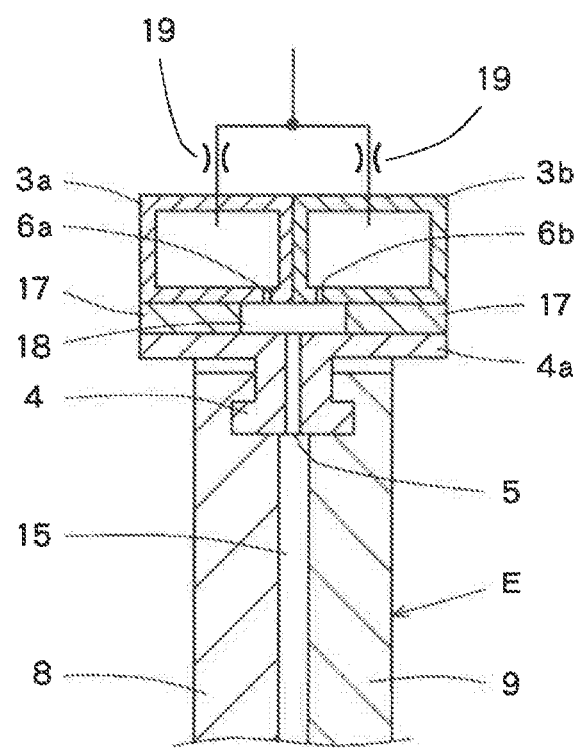
FIG. 5 is a partially enlarged cross sectional view according to a fourth embodiment.

FIG. 5 illustrates a fourth embodiment in which two manifold pipes 3a, 3b are arranged in parallel in the width direction of the discharge electrode E. The following is a specific configuration.

As illustrated in FIG. 5, a flange 4a is formed on the supporting member 4 and a spacer 17 is interposed between the flange 4a and the manifold pipes 3a, 3b, and thus a common passageway 18 is ensured between the flange 4a and the manifold pipes 3a, 3b.

And, small holes 6a, 6b are formed in the manifold pipes 3a, 3b to communicate with the common passageway 18.

Mounting the two manifold pipes 3a, 3b as described above is for the purpose of reducing the individual volumetric capacities thereof in order to provide a stable gas pressure distribution in the longitudinal direction of the manifold pipes.

It is noted that the manifold pipes 3a, 3b are each connected in parallel to a gas supply source not shown, and orifices 19 are provided between the gas supply source and the manifold pipes 3 so that the flow rate of replacement gas from the gas supply source is controlled by the orifices 19.

Also, it is understandable that the two manifold pipes 3a, 3b may be connected to separate gas supply sources.

Further, in the first and third embodiments, the gas guide holes 5 contiguous to the small holes 6, 6a, 6b are the orifices of the present invention. However, any one of the small holes 6, 6a, 6b and the gas guide holes 5 may be relatively smaller in opening diameter and any one of the small holes 6, 6a, 6b and the gas guide holes 5 with the relatively smaller opening diameter may be the orifices.

In short, as long as the orifices can be disposed in the communication process between the manifold pipe 3 and the gas passageway 15 to add a throttle resistance to the gas flow flowing through there, any configuration may be employed.

Also, the manifold pipes 3a, 3b and the supporting member 4 in the fourth embodiment are combined to support the discharge electrode E.

Figure 6:
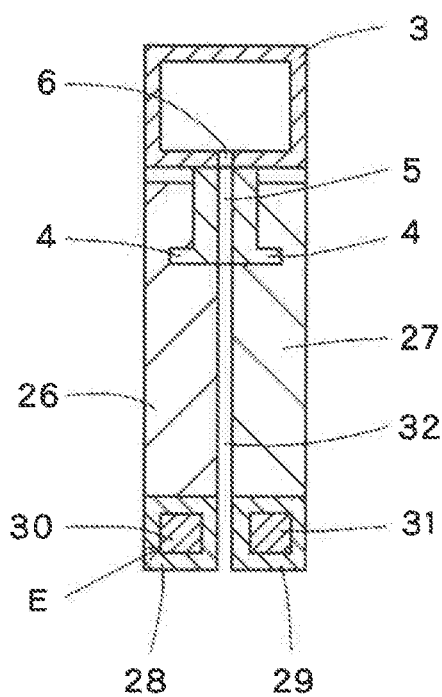
FIG. 6 is a partially enlarged cross sectional view according to a fifth embodiment.

FIG. 6 illustrates a fifth embodiment which includes: a pair of supporting plates 26, 27 formed of insulating material; dielectric materials 28, 29 installed at distal ends of the supporting plates 26, 27; and electrode members 30, 31 installed in the dielectric materials 28, 29, and a gas passageway 32 is defined between the electrode members 30, 31.

And, the electrode members 30, 31 are connected to a high-voltage power supply via circuitry which is not shown, and the multiple electrode members 30, 31 form the discharge electrode according to the present invention.

It is noted that the mounting structure for the supporting plates 26, 27 and the supporting member 4 is the same as the structure of mounting the electrode members 8, 9 to the supporting member 4 in the first embodiment.

Also, the facing separations between the supporting plates 26, 27 and the electrode members 30, 31 are defined as the gas passageway 32. Into the gas passageway 32, the replacement gas is guided via the small holes 6 in the manifold pipe 3 and the gas guide holes 5 which are the orifices.

The electrode members 30, 31 as described above are respectively enclosed with the dielectric materials 28, 29. Because of this, for example, even if the base material to be subjected to surface modification is an electric conductor, a short circuit can be prevented from being developed between the electrode members 30, 31 and the base material. Stated another way, where the base material is an electric conductor, a short circuit connected through a conductor with low resistance is made between the discharge electrode E and the counter electrode. However, such a short circuit as described above is not made by enclosing at least any one of the discharge electrode E and the counter electrode with the dielectric material(s) 28, 29.

It is noted that both the discharge electrode E and the counter electrode may not be covered with dielectric material.

In this manner, at least any one of the discharge electrode and the counter electrode is enclosed with dielectric material. This is because modifying treatment may be needed to be performed on the surface of the base material under a weak electric field.

Therefore, depending on a required electric field strength, only any one of the discharge electrode E and the counter electrode may be covered with dielectric material, or alternatively, both of the discharge electrode E and the counter electrode may be covered with dielectric material.

It is not noted that the manifold pipe 3 and the supporting member 4 in the fifth embodiment are combined to configure a support mechanism for the discharge electrode E.

Figure 7:
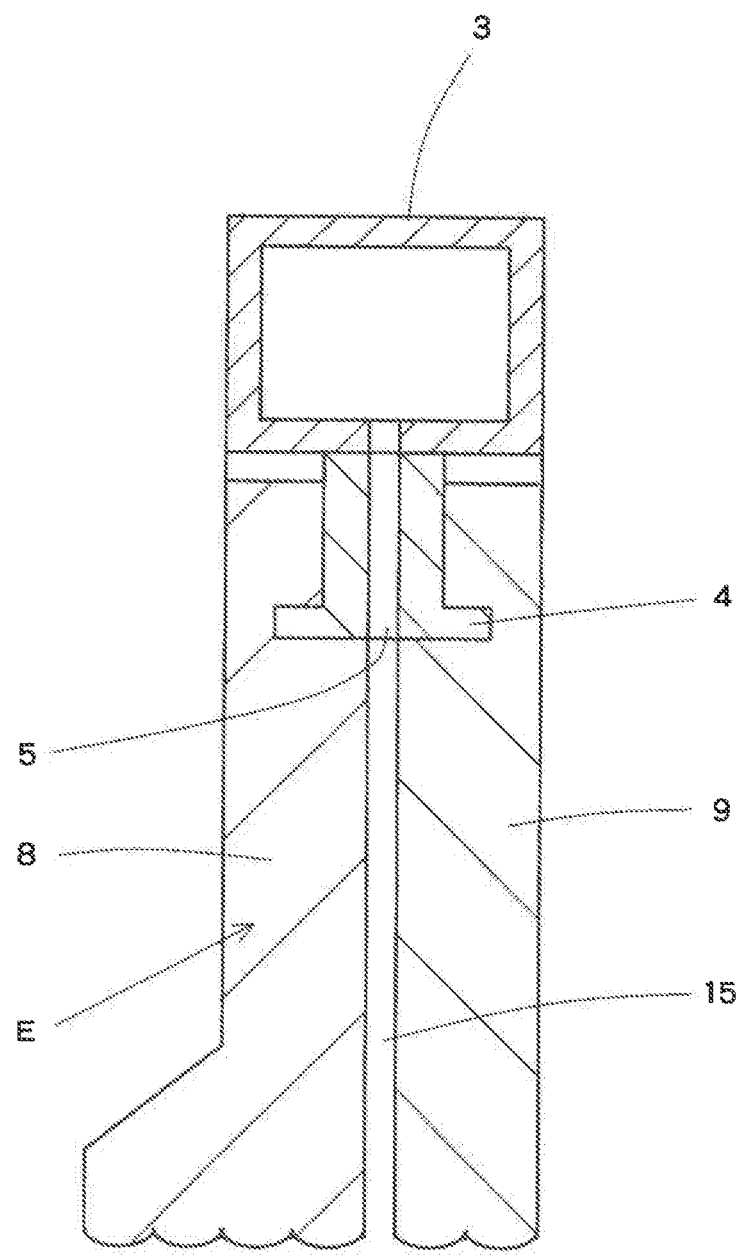
FIG. 7 is a partially enlarged cross sectional view according to a sixth embodiment.

An electrode member of an approximately symmetric shape is used for each electrode member in above-described first to fifth embodiments. However, for example, as in a sixth embodiment illustrated in FIG. 7, the electrode members 8, 9 may be shaped asymmetrically.

Specifically, in the sixth embodiment, the distal end of one electrode member 8 of the electrode members is expanded in the circumferential direction of the treatment roller R. Because the width of the distal end of the one electrode member 8 is increased in the circumferential direction of the treatment roller R in this manner, the electric field generation range can be extended accordingly.

It is noted that, in the sixth embodiment, the manifold pipe 3 and the supporting member 4 are also combined to configure the support mechanism for the discharge electrode E according to the present invention, and also the gas guide holes 5 formed in the supporting member 4 configure the orifices according to the present invention.

Also, the manifold pipe 3 and the supporting member 4 in the sixth embodiment are combined to configure the support mechanism for the discharge electrode E.

It is noted that, in the present invention, the orifice may be formed directly in the manifold pipe 3 or may be formed in another member such as the supporting member 4.

In either case, the orifice may be disposed in the communication process between the manifold pipe 3 and the gas passageway 15, 32.

Also, the orifice may be configured by one or more slits formed directly in the manifold pipe 3. And, the gas pressure in the manifold pipe 3 can be uniformly maintained by adjusting the width of the slit.

It is understandable that the slit configured in this manner should communicate with the gas passage 15, 32.

Also, in each of the above-described embodiments, any of the small holes formed in the manifold pipe 3 and the gas guide holes 5 formed in the supporting member 4 is defined as the orifices. However, the orifices according to the present invention are not necessarily limited to this. In short, the form of the orifices is no object as long as a throttle resistance is added to the gas flow passing through the manifold pipe 3 and the gas passage 15, 32 and the pressure in the manifold pipe is maintained uniformly.

For example, any of sintered metal, metallic mesh, ceramics, synthetic resin, nonwoven textile and the like may be incorporated in the manifold pipe 3. When such a porous bodies is used, a large number of continuous small holes of the porous bodies configures a plurality of orifices according to the present invention.

When the porous body is incorporated in the manifold pipe 3 as described above, the manifold pipe 3 may have a slit formed therein along the longitudinal direction thereof, and the aforementioned porous body may be incorporated to block the slit.

In each of the above-described embodiments, the base material is the resin-made film F and the treatment roller R transferring the resin-made film F is holding means. However, the holding means in the present invention is not limited to the treatment roller R.

For example, the holding means may be a conveyor on which the base material is loaded and transferred, a table on which the base material is placed, a hand of a robot arm moving the base material, or the like.

Also, the holding means in all of the above-described embodiments may be configured to serve also as the counter electrode. If the holding means does not serve also as the counter electrode, a counter electrode is required to be installed separately.

Then, the holding means is a conveyor, a counter electrode may be installed on the opposite side of the conveyor from the discharge electrode.

In either case, a necessary condition of the holding means in the present invention is to hold the base material within the electric field generated between the discharge electrode and the counter electrode.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A surface modifying device, comprising:
holding means for holding a base material to undergo surface modifying treatment;
an electrode chamber;
a manifold pipe that is secured to the electrode chamber through a coupling member and connected to a gas supply source;
a discharge electrode that includes a plurality of electrode members comprising adjacent face-to-face electrode members, the plurality of electrode members being supported either directly or via a supporting member by the manifold pipe, and maintained in length in a width direction of the base material;
a counter electrode that is disposed on the opposite side of the base material from the discharge electrode to face the discharge electrode, and allows an electric field to be generated between the discharge electrode and the counter electrode;
a gas passageway that is formed between the adjacent face-to-face electrode members of the plurality of electrode members of the discharge electrode, the gas passageway guiding replacement gas along the electrode members toward the base material, and ejecting the replacement gas toward a generation area of the electric field; and
orifices continuously disposed in a length direction of the manifold pipe, the orifices located between the gas passage and an inside of the manifold pipe;
wherein the manifold pipe constitutes a support mechanism for the discharge electrode.

2. The surface modifying device according to claim 1, wherein
the manifold pipe is a single manifold pipe disposed in a length direction of the discharge electrode.

3. The surface modifying device according to claim 1, wherein
the manifold pipe comprises a plurality of manifold pipes arranged in line in a length direction of the discharge electrode.

4. The surface modifying device according to claim 1, wherein
the manifold pipe comprises a plurality of manifold pipes arranged in parallel in a width direction of the discharge electrode.

5. The surface modifying device according to claim 1, wherein
the orifices disposed in a communication process between the manifold pipe and the gas passageway comprise either a plurality of small holes or one or more slits which are continuously disposed in the length direction of the manifold pipe.

6. The surface modifying device according to claim 5, wherein
either the plurality of small holes or the one or more slits constituting the orifices is formed directly in the manifold pipe.

7. The surface modifying device according to claim 5, wherein
the orifices disposed in a communication process between the manifold pipe and the gas passageway comprise a large number of continuous small holes of a porous body disposed in the manifold pipe.

8. The surface modifying device according to claim 1, wherein
the orifices disposed in a communication process between the manifold pipe and the gas passageway are formed in a throttle member disposed between the manifold pipe and the gas passage.

9. The surface modifying device according to claim 8, wherein
the throttle member comprises a porous body, and
the orifices comprise a large number of continuous small holes of the porous body.

10. The surface modifying device according to claim 1, wherein
the supporting member extending in the length direction of the manifold pipe is secured to the manifold pipe,
the plurality of electrode members face each other with the supporting member clamped between the electrode members, and
the supporting member has gas guide holes formed therein in a longitudinal direction of the manifold pipe, the plurality of gas guide holes communicating with the manifold pipe and the gas passageway.

11. The surface modifying device according to claim 10, wherein
the supporting member constitutes the throttle member, and
the gas guide holes constitute the orifices.

12. The surface modifying device according to claim 10, wherein
the supporting member includes a porous body, and a large number of continuous small holes of the porous body constitutes the orifices and the gas guide holes.

13. The surface modifying device according to claim 1, wherein
the electrode members constituting the discharge electrode are each formed of a plate shaped body.

14. The surface modifying device according to claim 1, wherein
the holding means constitutes a treatment roller for transportation of the base material made up of an overlength item.

15. A surface modifying device according to claim 1, wherein
the holding means constitutes any one of a conveyor on which the base material is loaded, a table on which the base material is loaded, and a hand of a robot arm on which the base material is loaded.

16. The surface modifying device according to claim 1, wherein
the holding means serves also as a counter electrode.

17. The surface modifying device according to claim 1, wherein
at least any one of the discharge electrode and the counter electrode is enclosed with dielectric material.

* * * * *